United States Patent
Bourrieres

(12) 
(10) Patent No.: US 6,183,839 B1
(45) Date of Patent: Feb. 6, 2001

(54) STENCIL FOR DEPOSITING AND PORTIONING VARIOUSLY THICK SPOT LAYERS OF VISCOUS MATERIAL AND METHOD

(76) Inventor: Francis Bourrieres, 80 Chemin des Cabouillous-Le Carreyrat, F-82000 Montauban (FR)

(*) Notice: Under 35 U.S.C. 154(b), the term of this patent shall be extended for 0 days.

(21) Appl. No.: 08/776,331
(22) PCT Filed: Jul. 5, 1995
(86) PCT No.: PCT/FR95/00898
  § 371 Date: Jan. 6, 1997
  § 102(e) Date: Jan. 6, 1997
(87) PCT Pub. No.: WO96/01743
  PCT Pub. Date: Jan. 25, 1996

(30) Foreign Application Priority Data
  Jul. 7, 1994 (FR) .................................. 94 08518

(51) Int. Cl.$^7$ ..................................................... B32B 3/10
(52) U.S. Cl. .......................... 428/131; 427/96; 427/282; 427/288; 427/290; 427/436; 427/555; 427/596; 428/220; 428/332; 428/337; 428/480
(58) Field of Search ..................................... 428/131, 220, 428/332, 337, 480; 427/290, 555, 282, 596, 288, 96, 436

(56) References Cited

U.S. PATENT DOCUMENTS

| | | | |
|---|---|---|---|
| 3,981,237 | 9/1976 | Rhodes | 101/128.2 |
| 4,208,005 | 6/1980 | Nate et al. | 228/175 |
| 4,359,928 | 11/1982 | Blessington et al. | 101/128.4 |
| 4,379,185 | * 4/1983 | Smith et al. | |
| 4,537,647 | * 8/1985 | Foster | 156/245 |
| 4,571,864 | 2/1986 | Bopp | 38/102.5 |

(List continued on next page.)

FOREIGN PATENT DOCUMENTS

| | | |
|---|---|---|
| 0593050 | 4/1994 | (EP) . |
| 2054462 | 2/1981 | (GB) . |
| 63-222496 | 9/1988 | (JP) . |
| 7-81027 | 3/1995 | (JP) . |

OTHER PUBLICATIONS

"Adhesive Applied at a Single Stroke", 2 page Product brochure, DEK, distributed Sep. 19, 1996.

A. Hobby, "Screen Printing Adhesive—The Complete Solution", DEK Printing Machines Ltd., UK, (Oct. 25, 1996) (13 pages).

"Technology Insight Pump Printing" TM, Electronics Manufacture and Test, Sep. 1996, page 18.

Miranda, R., et al, "Application of Conductive Adhesives to SMT PCB Assembly", pp. 761–769 of Proceedings on Factory Automation and Information Management, Limerick, Ireland (1991), (No Month Avail.).

R. Hudson, "Automatic Screen Printing,", Printed Circuit Assembly, Aug. 1988, pp. 24–29.

(List continued on next page.)

Primary Examiner—Bernard Pianalto
(74) Attorney, Agent, or Firm—Vidas, Arrett & Steinkraus

(57) ABSTRACT

The present invention concerns a stencil for the depositing and gauging of more or less thick, point-base coats of a viscous product.

To remedy the problems found with a serigraphic screen made of polyester or metal cloth and a metal stencil, the present invention proposes use of a solid sheet of uniform composition made of synthetic material and, preferably, polyester without the inclusion of wires. This polyester solid sheet is bored mechanically or thermally at the places desired. Since the polyester cloth is solid, it admits of tension forces greater than those of wire mesh cloths or at least equal to those of metal stencils.

20 Claims, 5 Drawing Sheets

U.S. PATENT DOCUMENTS

| | | | |
|---|---|---|---|
| 4,704,305 | 11/1987 | Berger et al. | 427/96 |
| 4,796,560 | 1/1989 | Berger et al. | 118/211 |
| 4,910,048 | 3/1990 | Sinclair | 427/208 |
| 4,981,746 | 1/1991 | Matsuo et al. | 428/195 |
| 5,046,415 | 9/1991 | Oates | 101/128.21 |
| 5,104,213 * | 4/1992 | Wolfson . | |
| 5,196,317 | 3/1993 | Kulesza et al. | 437/183 |
| 5,220,724 | 6/1993 | Gerstner | 29/840 |
| 5,265,773 | 11/1993 | Harada | 222/261 |
| 5,314,709 | 5/1994 | Doany et al. | 427/96 |
| 5,334,815 | 8/1994 | MacNaughton et al. | 219/121.7 |
| 5,347,925 | 9/1994 | Holderegger | 101/127 |
| 5,360,665 | 11/1994 | Sato et al. | 428/323 |
| 5,458,949 | 10/1995 | Komiyama et al. | 428/141 |
| 5,475,048 | 12/1995 | Jamison et al. | 524/439 |
| 5,532,439 | 7/1996 | Watanabe et al. | 118/213 |

OTHER PUBLICATIONS

A. Duck, "Dispensing SMD Adhesives: Rotary Pump Technology vs. Stencil Printing Technology", EMI (May/Jun. 1996), pp. 17–19.

Rico Micro Electronics, "High Quality Mask for Solder Printing for Wiring Board", Nikkan Kogya Shimbun, Jan. 18, 1995, 1 page.

8 pages product literature for E–Fab tm XL. "Electroformed Stencil", AMTX, Inc., variously dated as No Month Avail. 1994–Apr. 30, 1996.

* cited by examiner

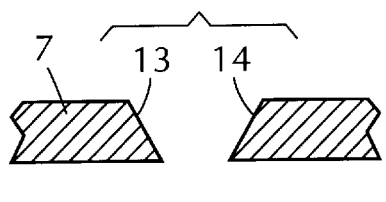
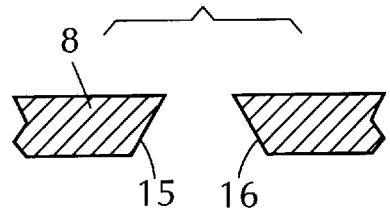
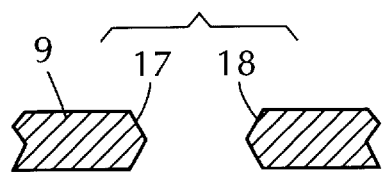
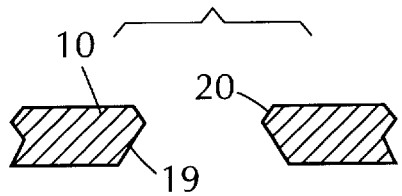
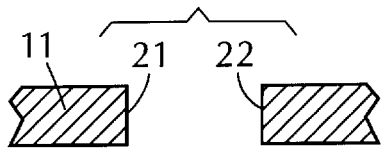
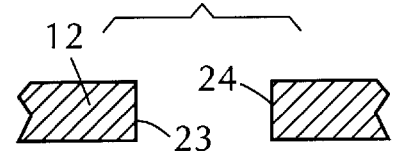
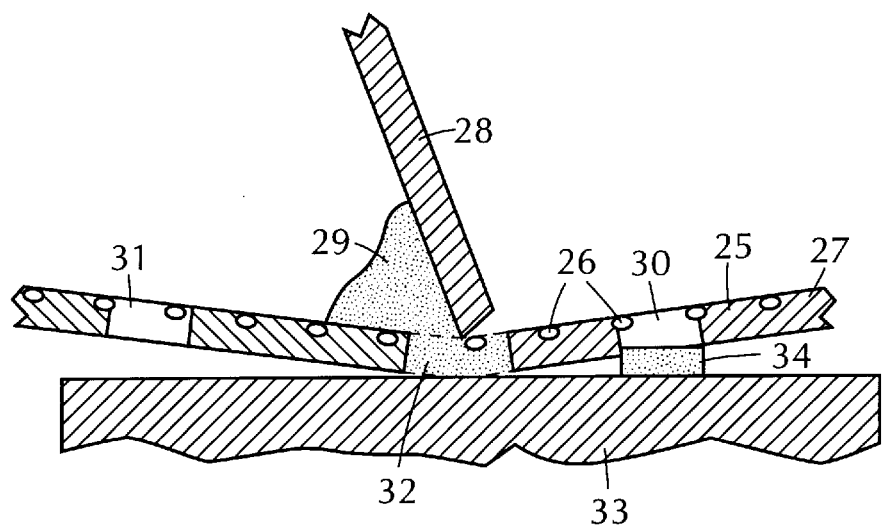

STENCIL FOR DEPOSITING AND PORTIONING VARIOUSLY THICK SPOT LAYERS OF VISCOUS MATERIAL AND METHOD

The present invention concerns a stencil for the depositing and gauging of more or less thick, point-base coats of a viscous product.

This invention falls within the technologies of surface mounting of electronic components on printed or microelectronic circuits.

In electronics manufacturing, the coating of so-called thick layers, namely solder paste and glue, are done by means of a syringe or serigraphy. The coating by syringe is a risky process of a limited output. The precision of its markings, the duration of the operation, and the slenderness of the lines and networks made, make this first operation unusable for current industrial applications.

Although paste and glue can be coated by liquid distribution equipment, the preferred method is serigraphy through a screen, by using a metal screen or stencil manufactured by chemical cutting, laser cutting, or electroforming. These three methods are satisfactory for dimension of up to 300 micro-meters, but smaller dimensions are required.

The use of a stencil, through which is deposited a product, cream or solder paste, which then form the desired contact soldering pins, is the most prevalent industrial procedure.

Three types of stencils are known today: the woven metal cloth of serigraphy, the polyester woven cloth of serigraphy and the metal stencil. Their technical qualities are determined depending on their efficiency or percentage of opening, tie off contact, and the force of tension applied.

The efficiency corresponds to the degree of sealing of the stencil holes which is a function of the presence of wires/fibers in the case of a woven stencil.

The off-contact is the angle that can be formed by the stencil with the support surface in working position when the squeegee is being supported. The greater the angle, the better is the extraction of the viscous product of the stencil. Obtaining an off-contact presupposes a considerable tension force of the stencil and a good coefficient of elasticity.

Depending on the off-contact, the metal serigraphic cloth is not as good as the polyester serigraphic cloth and better than a metal stencil.

For efficiency and tension force, the polyester serigraphic cloth is not as good as the metal serigraphic cloth, which in turn is not as good as the metal stencil.

The method and means of machining the stencils determine also the quality of the deposits as will be explained later.

The present invention remedies those drawbacks by presenting a means of applying thick coats by the use of a stencil made of a uniformly consistent solid sheet of a pliable and stretchable synthetic material bored by a cutting means in conformance with the deposits to be made.

Such stencils have been used.

Patent GB 2054462 uses such a stencil to mask out metal with a view to an electrochemical etching, hence a removal of metal and not a depositing of viscous product.

U.S. Pat. No. 3,981,237 uses such a stencil for ink printing on textiles, the stencil or mask being mounted on a rotary drum.

The purpose is different in the present invention, which aims to deposit and to gauge viscous products.

The invention is characterized essentially by a stencil for the depositing and gauging of more or less thick, point-base coats of a viscous product, the product being gauged by means of said stencil of a uniformly consistent solid sheet made of a pliable and stretchable synthetic material with transfer bores in conformance with the surface of each one of the points to be made, the size of said bores, in relation to the thickness of the sheet, making it possible to gauge the product amount to be deposited and to control the height of the deposit.

According to another feature of the invention, the stencil bores are round in shape.

According to still another feature of the invention, the bores are made by mechanical means. The stencil is preferably made of a sheet of polyester or a similar or equivalent synthetic material.

The present invention concerns also the stencil, as a device, which the process is meant to embody.

To remedy the problems found with a serigraphic screen made of polyester or metal cloth and a metal stencil, the present invention proposes to use a cloth made of polyester material or the like; however, this cloth no longer consists of fibers/wires but is a solid sheet in itself. This solid sheet made of polyester is mechanically bored at the desired places. Owing to the fact that the polyester cloth is solid, it admits of tension forces greater than those with wire mesh cloths and at least equal to those with metal stencils.

BRIEF DESCRIPTION OF THE DRAWINGS

The description that follows, given with regard to the attached drawings in a way applicable but not limited to them, gives us a better understanding of the advantages, aims and features of the present invention.

FIG. 3 depicts a section of a stencil and its respective qualities.

FIG. 4 depicts another section of a stencil and its respective qualities.

FIG. 5 depicts another section of a stencil and its respective qualities.

FIG. 6 depicts another section of a stencil and its respective qualities.

FIG. 7 depicts another section of a stencil and its respective qualities.

FIG. 8 depicts another section of a stencil and its respective qualities.

FIG. 9 depicts a view of a thick coat depositing in progress.

FIGS. 1 and 2 depict the textures of known types of masks and stencils.

FIG. 1 shows a mesh 1 of a network 2 made in a fabric of stainless wires 3, a whereas, FIG. 2 shows a mesh 4 of a network 5 made in a fabric of polyester wires 6.

Figure 1:
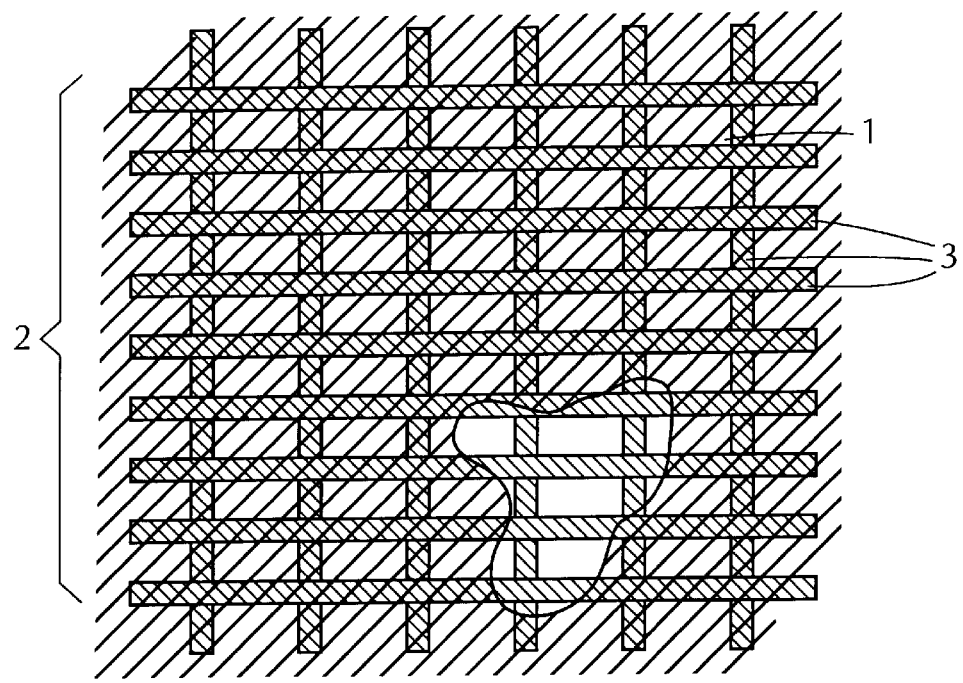
FIG. 1 depicts the texture of a known types of mask and stencil.
Figure 2:
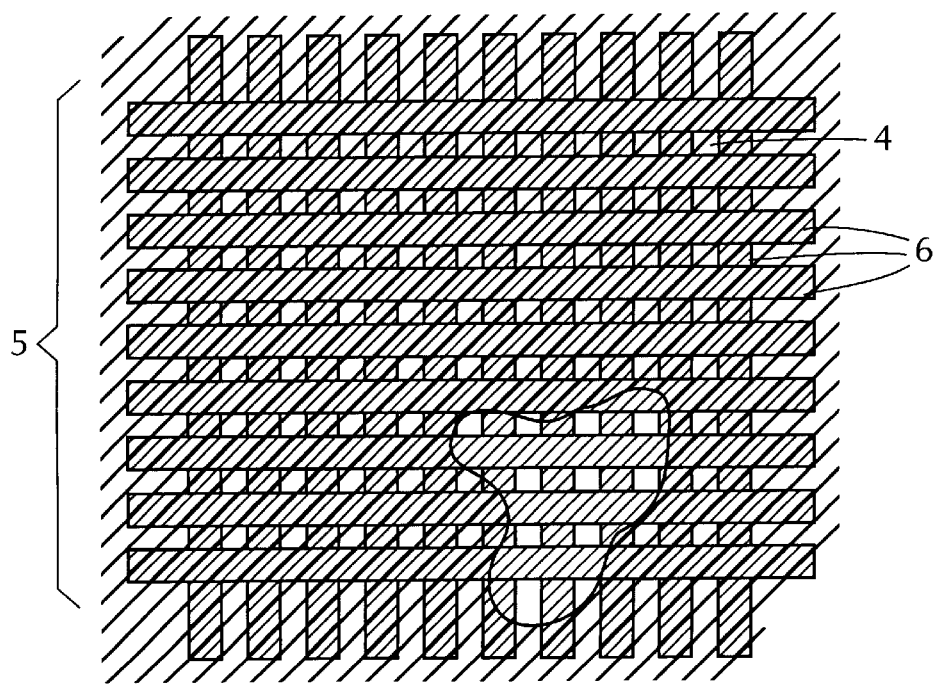
FIG. 2 depicts the texture of a known type of mask and stencil.

Comparing FIGS. 1 and 2, meshes 1 and 4 have identical surfaces. The efficiency of the network 2, however, is greater than that of the network 5, because the diameters of the wires 3 are smaller than the diameters of the wires 6. The tension value is identical for networks 2 and 5. Lastly, the off-contact is better for the network 5 than for the network 2.

FIGS. 3–8 show sections of stencils and their respective qualities.

FIG. 3 illustrates a section of serigraphic screen 7, FIG. 4 illustrates a section of serigraphic screen 8, FIG. 5 illustrates a section of serigraphic screen 9, FIG. 6 illustrates a section of serigraphic screen 10, FIG. 7 illustrates a section of serigraphic screen 11 and FIG. 8 illustrates a section of serigraphic screen 12. In each of FIGS. 3–8 each section of screen passing by an opening whose sides 13 and 14 for screen 7; 15 and 16 for screen 8; 17 and 18 for screen 9; 19 and 20 for screen 10; 21 and 22 for screen 11; and 23 and 24 for screen 12; have different shapes.

These shapes correspond to different serigraphic qualities.

The screens are considered as being made of the same material and used by filling at the top and depositing at the bottom, as shown in FIG. 3.

As may be seen in FIG. 3, sides 13 and 14 correspond to a good filling, because sides 13 and 14 are closer to each other at the bottom than at the top.

As may be seen in FIG. 4, sides 15 and 16 correspond to a good demolding, because sides 15 and 16 are closer to each other at the top than at the bottom.

As may be seen in FIG. 5, sides 17 and 18 correspond to a customary compromise between these two shapes and these two qualities. The sides are close to each other at an equal distance from the two surfaces of screen 9.

As may be seen in FIG. 6, sides 19 and 20 correspond to a compromise that promotes demolding, because they are closer to each other at a shorter distance from the top surface than from the bottom surface of screen 10.

The four shapes presented above correspond to a chemical embodiment of the cuttings.

In FIG. 7, sides 21 and 22 correspond to an ideal shape. They are parallel to each other and perpendicular to screen 11.

In FIG. 8, sides 23 and 24 correspond to a shape obtained by laser cutting. Their shapes are very close to those of sides 21 and 22; however, they are rough.

Serigraphy uses a metal or polyester cloth for support. A mask made with the help of an ultraviolet photosensitive film makes it possible to embody stencils. The polyester cloth affords a certain elasticity, which allows an off-contact to go up to 3 or 4 mm without image distortion. The off-contact promotes demolding, for it diminishes the lateral surfaces in contact.

This off-contact is very important, because it enables the extraction of the material to be deposited, from the hole in the cloth, not obstructed at the time of passage of the squeegee. The greater the tension force of the cloth, the better will be the extraction from the cloth and the better will be the deposit.

In the case of a polyester cloth, the greater the number of threads per length unit, the greater the tension. A greater number of wires affords less efficiency (the efficiency being the ratio between the open surface and the total surface of the mesh).

The percentage of opening being less, passage of the pasty and/or viscous product will be all the more difficult and will become impossible for small opening sizes.

The metal cloth, generally made of stainless steel mesh, makes it possible (because of its superior resistance) to afford a greater percentage of opening to the polyester (a 70% maximum). Hence, the size of the deposits can be reduced. The off-contact possible, however, will be less than with the polyester, and extraction can be a more delicate operation, which entails the risk of carrying along the product in the screen. (Note: the strong tension is close to the breaking point.)

When the size of the deposits required has to be even smaller recourse to a metal stencil becomes necessary. In that case, the percentage of opening is 100%. Now, the main fault with the metal stencil is that it practically does not admit of any off-contact. The metal is not stretchable; it is rigid and its admissible bending angle is very weak.

In practice, a pseudo-off-contact is obtained by suspending the metal stencil on a polyester wire sieve.

With metal, the contact area is very large.

With a synthetic sheet material which according to the invention is pliable and stretchable, the admissible bending angle being very large, a contact surface of small width is obtained.

This is a major problem, for it often happens with small openings that the forces of adherence of the product to be deposited onto the lateral surface of the hole are greater than the forces of adherence of the product on the support. In that case, the deposit cannot be made and the product is carried along on the stencil.

FIG. 9 shows a view of a deposit of thick coating in progress.

FIG. 9 illustrates a stencil 25 comprising wires 26 and a material 27, on which rests a squeegee 28 which pushes a solder paste 29 or glue or some other viscous material into the holes 30, 31, and 32 the solder paste emerging from the holes and being deposited in the form of points 34 on a printed circuit 33 when the stencil 25 moves away from a printed circuit 33.

The stencil 25 is made according to processes known by the expert. It comprises wires 26 which assure solidity and a material 27 which assures impermeability of the stencil 25. The squeegee 28 is of a known type. It has a hardness adapted for impeding the passage of paste between it and the stencil 25. The solder paste 29 is a viscous paste containing different components with materials that are conductors of electricity. It spills into the holes 30, 31 and 32. In FIG. 9, the hole 31 is much smaller than the hole 30. The hole 30 is empty, and the hole 32 is being filled.

The stencil is stretched upward in order to be at a distance from the printed circuit 33 before and after passage of the squeegee 28. It supports both the solder paste 29 on the stencil 25 and the stencil 25 on the printed circuit 33.

When the squeegee moves from the right of FIG. 9 to the left, the solder paste enters the holes 30, 32, then 31 and emerges from those holes when the stencil moves away from the printed circuit 33. The solder paste 29 then constitutes points 34 on the printed circuit 33.

This figure shows clearly why the shape of the sides of the holes 30, 31 and 32 made in the stencil 25 corresponds to the qualities depicted in FIGS. 3–8.

It is also clear that the qualities of the stencil 25 depend on any wires 26 inserted in the material 27, on the elasticity of the stencil 25, on its thickness and on the way its holes are made.

According to the present invention, the serigraphic screen or stencil 25 consists of a solid sheet made of an stretchable and pliable synthetic material such as polyester or plastic derivatives or the like, machined preferably by mechanical cutting in order to make round holes.

According to the invention, the material used for making the stencil is suitable for being shaped into position by plastic deformation, for instance, to permit the passage of excessive thicknesses.

The present invention concerns also the stencil 25 as a device, which the process is meant to embody.

To remedy the problems found with the serigraphic screen made of polyester or metal cloth and a metal stencil, the present invention proposes use of a serigraphic screen made of polyester or derivatives on a solid sheet. This polyester solid sheet is bored mechanically or thermally at the desired places. Since the polyester cloth is solid, it admits of tension forces greater than those of wire mesh cloths and at least equal to those of metal stencils.

Figure 10:
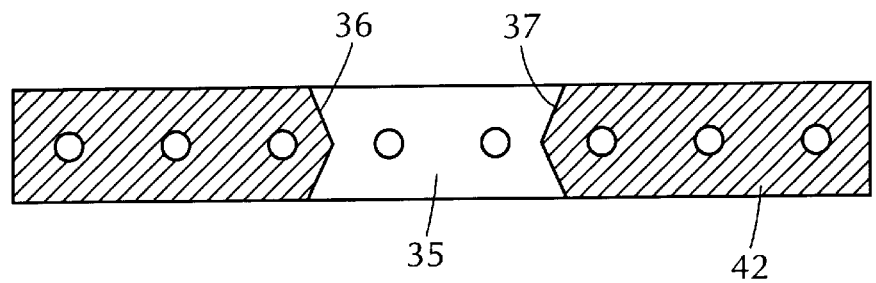
FIG. 10 shows a prior art stencil.
Figure 11:
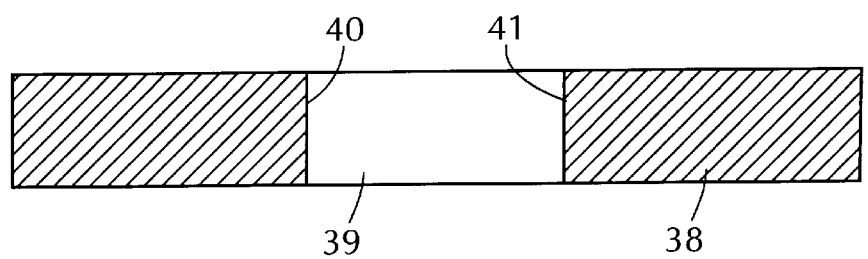
FIG. 11 shows an embodiment of a stencil according to the present invention.

FIG. 10 illustrates a stencil 42 comprising a hole 35 whose sides 36 and 37 are a classical compromise in the electronic industry. FIG. 11 illustrates a stencil 38 according to the invention containing a hole 39 whose sides 40 and 41 are made by mechanical means.

The stencil 42 of FIG. 10 is made of metal. It comprises a hole 35 whose sides 36 and 37 have been shown in FIG. 5 as the customary compromise in the electronic industry. The stencil 42 does not accept the off-contacts well, possesses a very limited bending angle because of its basic material, and has high coefficients of friction.

The stencil 38 as shown in FIG. 11, according to the invention consists of a solid polyester sheet machined by mechanical cutting. It contains a hole 39 whose sides 40 and 41 are made by boring and are therefore almost ideal in shape, as shown in FIG. 2.

The stencil 38 accepts high off-contacts, possesses a very great bending angle and a weak coefficient of friction. The precision of the cutting shape is very great.

Figure 12:
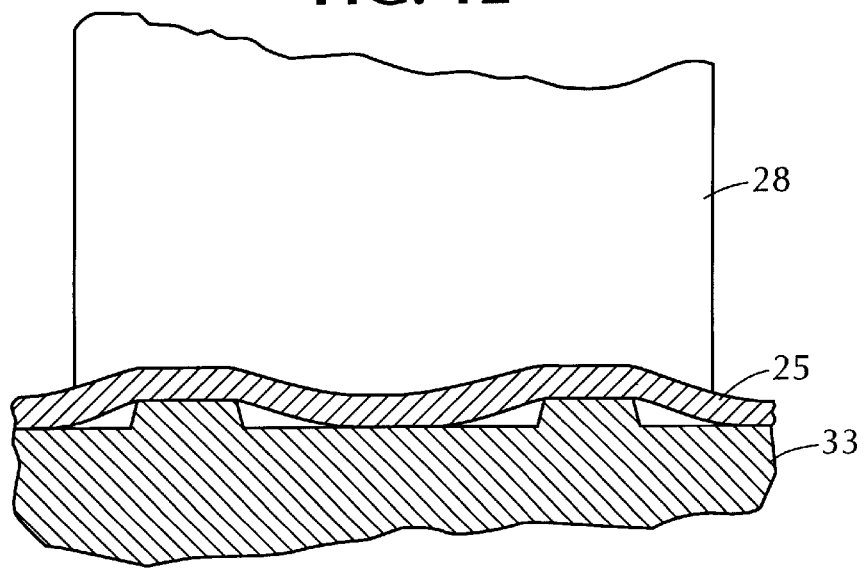
FIG. 12 illustrates a sectional view of a stencil according to the invention on the printed circuit plate which is to receive the deposits.

FIG. 12 shows a stencil made according to the present invention.

FIG. 12 shows also the embodiment of a deposit on a substrate surface 33 through a stencil according to the invention 25 by means of a squeegee 28.

The printed circuit that is going to receive the deposits of viscous or pasty and/or adhesive products has a relief or roughness of varying thicknesses. These reliefs are due to the presence of input tracks and areas.

The rule to be followed in order to have a transfer of the product to be deposited onto the substrate is that there should be contact between the stencil and the substrate at the exact place where the squeegee exerts a linear pressure and opposite an opening.

If there is no contact opposite the opening, the product will be guided by the hole but will be received uncertainly with dispersions and burrs.

In the case where a sheet stencil according to the invention is used (FIG. 12), the criteria of pliability and stretchability of the stencil associated with the low values of the admissible bending radius entail a deformation of the stencil, enabling it to come into contact with the substrate as well as on the lowest points.

Different machining processes can be provided; however, the boring of round holes seemed to be the process most suited to the polyester sheet stencil according to the invention.

If the cutting parameters are well adapted, the edge is free, and clear with possibilities for bore diameters of as low as 0.1 mm.

The big advantage of mechanical machining with drills lies in the fact for one same bore diameter, it is the same drill that operates irrespective of the number of holes or openings of the particular diameter to be made.

The drill is a tool which has a constant diameter and profile with a constant calculated cutting speed; it machines a piece of material of a constant thickness and nature. This yields diameters with constant holes having an identical surface finish on all the holes of the same diameter. The holes are smooth, with a surface roughness on the order of 0.001 micron (versus 0.1 micron with a laser cutting).

The constancy of the parameters applied to the sheet stencil according to the invention as well as the fact that the holes made for one same diameter are invariably identical makes it possible to have deposits that are invariably the same.

Modifying the surface finish of the bores makes it possible to get different results particularly on the proportioning out of the deposited products and the height of the points made in relation to the diameter of the bores.

To get a better understanding in this FIG. 19, the stencil 25 has been illustrated, on the one hand, as being applied to the substrate 33 (printed circuit) and, on the other hand, in the course of lifting to represent glue removal by the stencil and the action it can have on the formation of glue points.

Figure 13:
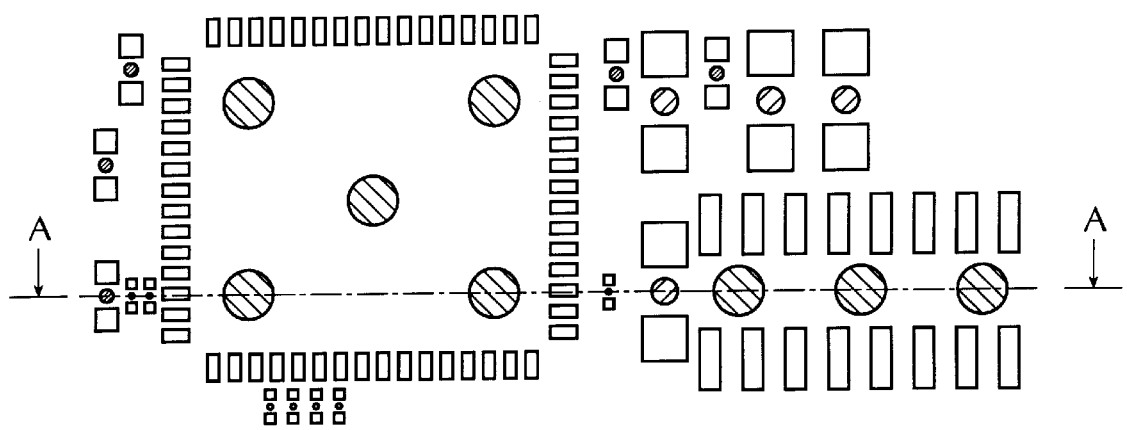
FIG. 13 illustrates a top-view and sectional example of a simultaneous deposit of glue points with different heights and diameters depending on the type of component.
Figure 14:
FIG. 14 illustrates a side view of the illustration shown in FIG. 6.

FIG. 13 illustrates in top view and FIG. 14 in a sectional view an example of a deposit of glue points with different heights to fasten different components to the circuit.

Figure 15:
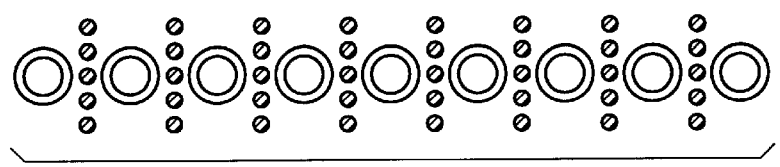
FIG. 15 illustrates in top view an example of how the invention is used to create physical barriers between areas where there is risk of a bridge at the time of passage of the component-welding wave.
Figure 16:
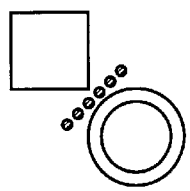
FIG. 16 illustrates in top view an example of how the invention is used to create physical barriers between areas where there is risk of a bridge at the time of passage of the component-welding wave.

FIGS. 15 and 16 illustrate an example of a buildup of physical barriers by glue points between areas where there is a bridge risk at the time of passage with the welding wave.

Figure 17:
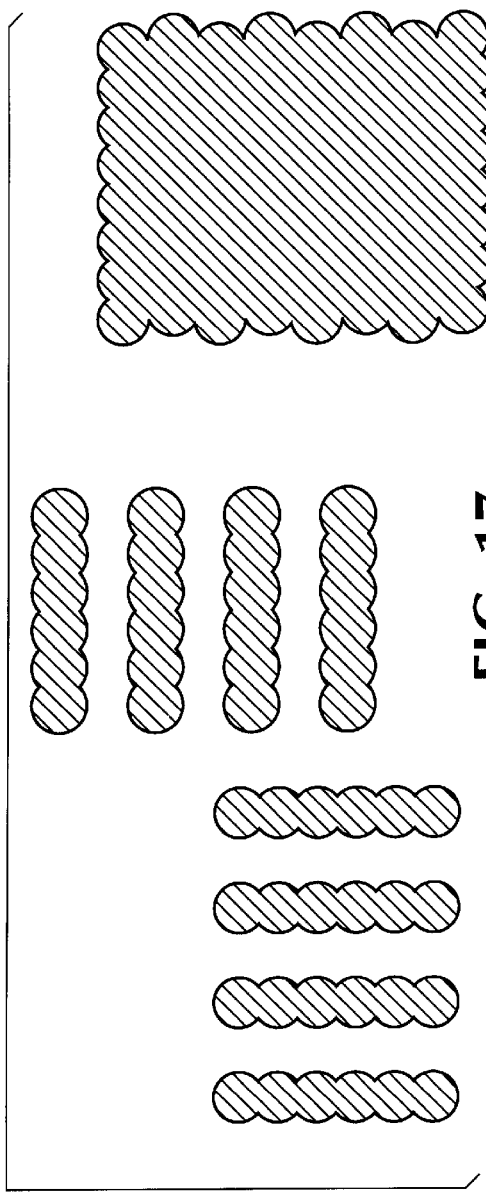
FIG. 17 illustrates examples of embodiment wherein invention implements continuous lines or full surfaces.
Figure 18:
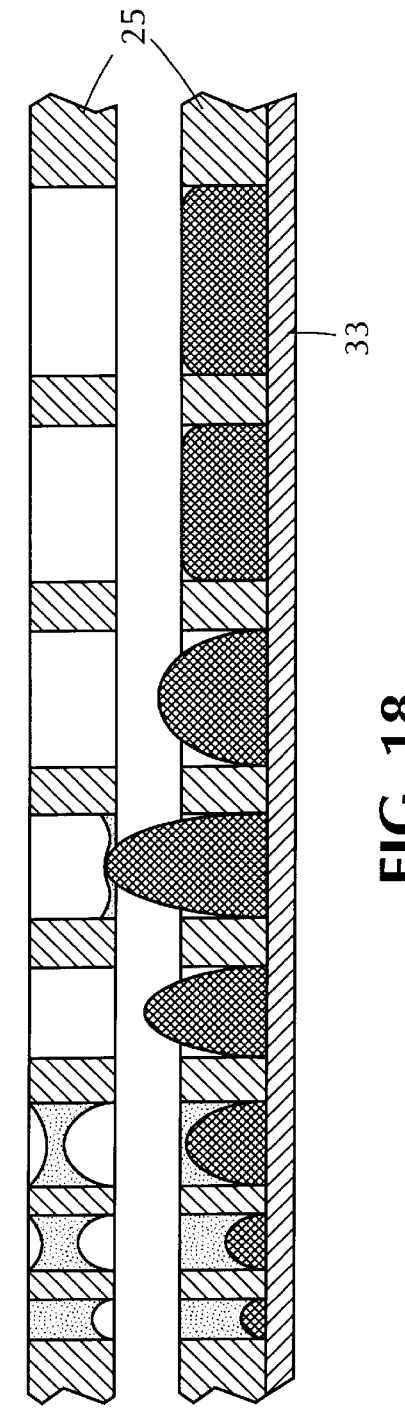
FIG. 18 illustrates the stencil schematically, in use in the different cases of the figures.

FIG. 17 illustrates an embodiment by points of continuous dashes and full surfaces.

The material that remains clinging to the side walls of the holes of the same diameter is invariably identical on all sides.

The polyester solid sheet does not have any insert or particular shape. Its thickness is constant and it is uniform in composition.

Further, the polyester used is transparent; hence, marking of the respective positions of the stencil and of the printed circuit is better.

The height deposited depends on the diameter of the hole, the viscosity of the product, its density, the thickness of the stencil and the forces that oppose the flowing out (the surface roughness). In the case of polyester, with the surface roughness being constant and the other parameters being constant, the result is constant, i.e., for one same hole diameter, we always get the same deposit height. With a metal stencil, the surface roughness height being variable, the deposits are inconstant.

Viscosity is the factor with the greatest impact on the height of the deposit: the weaker the viscosity, the more the height deposited will approximate the thickness of the stencil irrespective of the diameter of the hole.

For high viscosities, e.g., a deposit of adhesives, the deposited height depends on the diameter and thickness of the stencil. For very small diameters (200 to 400 μmeters), the deposited height is much less than the thickness of the stencil. The hole serves as a reservoir and refills upon each passage of the squeegee with a quantity of viscous product equal to that which has been deposited onto the circuit. Adhesion to the sides of the hole carries along one part with the stencil and leaves another part only on the substrate.

The part carried along by the stencil is very well controlled and repetitive because of the constancy of the hole's surface roughness.

For the same given thickness and for the same diameter or size of bore (800 to 1200 μmeters), the partial carrying along of the very viscous glue at the time of separation causes the systematic buildup of a dome whose height may reach as much as 1.8 times the thickness of the stencil.

For diameters greater than 2000 μmeters and for the same thickness, the deposited heights are identical to the stencil's thickness. If one wishes to deposit greater heights, it will be necessary to choose a thicker stencil and to select an appropriate boring diameter, in the realization that for smaller diameters the deposited height will be identical irrespective of the stencil's thickness.

The properties make it possible to put and keep together side by side (there is no limit to shape) very high glue segments and very low glue segments. The ratio of 1 to 20 is possible. It is also possible to glue side by side microcomponents and large blocks.

Its considerable advantage over a metal stencil is that, despite its equal tension, the stencil made according to the present invention admits of more elasticity. This makes it possible to have an off-contact at the time of the deposit, while assuring close contact with the substrate. Since the percentage of opening is 100%, the size of deposit possible becomes even smaller.

For solder paste deposits, it is preferable to deposit circular shapes even on areas receiving varied shapes, such as the square or the rectangle. The circle will be the easiest to deposit, because it has the largest surface for the smallest perimeter, the adherency being maximal on the support for a minimal drag force by the stencil.

The deposit of micropoints of glue or solder paste by the use of the device that is the subject of the present invention reaches limit diameters of about 100 μmeters with a limit height of 50 μmeters.

Other advantages are added to these qualities of the bored solid-sheet polyester stencil, namely:
the cost is divided by at least 3;
the means to be employed for making the present stencil are less costly than those for a metal stencil;
polyester is acid- and solvent-resistant;
the life span is greater than that of the metal stencil.

The polyester stencil can undergo, upon demand, a permanent plastic deformation avoid certain circuit areas if necessary.

What is claimed is:

1. A stencil for the deposit and apportioning of more or less thick layers, based on points or in the form of points, of a viscous product on a substrate by passing a scraper over the stencil to bring the stencil into close contact with the substrate in the place where the scraper exerts a linear pressure, the stencil constructed of a solid and uniformly thick sheet of a synthetic material with holes bored therethrough, wherein:
the sheet thickness is determined according to the greatest height of deposit to be made on the substrate; and
the sheet has different boring diameters sized according to the height of the different deposits of the viscous product to be made and the thickness of the sheet, whereby the viscous product proportions deposited and the deposit heights obtained by a passage of the scraper are different.

2. A stencil according to claim 1, wherein the smallest boring diameter of the stencil has a dimension less than the thickness of the stencil sheet.

3. A stencil according to claim 1, wherein each of the borings regardless of its dimension has a consistent diameter over the entire thickness of the sheet.

4. A stencil according to claim 3, wherein the boring holes made for any one of the different diameters are essentially identical for one same diameter.

5. A stencil according to claim 3, wherein the walls of the borings are relatively smooth, having a surface roughness on the order of 0.001 micron.

6. A stencil according to claim 1, wherein the sides of the borings are parallel to each other.

7. A process for the deposit and apportioning of a viscous product in more or less thick layers based on points or in the form of points on a substrate, the process comprising
placing a flat stencil above, and spaced apart from, the substrate, wherein the stencil has borings of at least two different diameters and which correspond to a pattern of the deposit to be made on the substrate and
applying a viscous product onto the substrate through the borings in the stencil by passing a scraper over the stencil, the scraper exerting a linear pressure on the flat stencil perpendicularly to said stencil and to the substrate in a direction opposite said substrate, the linear pressure being sufficient to deform the stencil and to put it in contact with the substrate at the point of the linear pressure,
the stencil constructed of a solid and uniformly thick sheet of an elastic synthetic material with transfer borings therethrough which are parallel to each other and perpendicular to the stencil, the tension on the stencil being sufficient to create an off-contact between the stencil and the substrate on the side opposite the scraper, the stencil being further characterized in that the viscous product quantity deposited at each point, and the height of the deposited point, are determined according to the thickness of the stencil sheet and the diameter of the corresponding transfer boring, so that each of the deposits that come from borings which have the same diameter and the same surface roughness will have the same height.

8. A process according to claim 7, wherein the stencil has borings with at least two different diameters to make deposits with different heights onto the substrate.

9. A process according to claim 7 wherein the viscous product is a glue or solder paste.

10. A process according to claim 7 wherein the borings are circular.

11. A process according to claim 7 wherein the stencil sheet is made of polyester.

12. A process according claim 7, wherein the stencil borings ale relatively smooth, having a surface roughness on the order of 0.001 micron.

13. A process according to claim 7, wherein the stencil borings are made by drills.

14. A process according to claim 7, wherein the borings are laser-made.

15. A process according to claim 7, wherein the thickness of the stencil sheet is chosen so that a boring diameter of 200 to 400 micrometers makes a deposit height less than the stencil thickness and so that a boring diameter greater than 2000 micrometers makes a deposit height substantially the same as the thickness of the stencil sheet.

16. A process for the manufacture of a serigraphy stencil from a solid and uniform sheet made of a synthetic material equipped with holes made by bores, the process comprising:

selecting the sheet thickness according to the greatest height of deposit to be made on the substrate, and making bores in the sheet with different diameters according to the height of the different deposits to be made and the thickness of the sheet selected.

17. A process according to claim 16, characterized in that it consists of using a mechanical tool for cutting the sheet of synthetic material.

18. A stencil for the deposit and apportioning of more or less thick layers, based on or in the form of deposited points, of a viscous product for mounting electronic components on a substrate by passing a scraper over the stencil to bring the stencil into contact with the substrate where the scraper exerts a linear pressure, wherein the stencil is constructed of a solid sheet of a synthetic material having a substantially uniform thickness with holes bored therethrough, and wherein:

the sheet thickness is determined according to the greatest height of the viscous product to be deposited on the substrate; and whereby the amount of viscous product deposited from the bores of different diameters is different and the height of such viscous product deposits is different.

19. A process for the deposit and apportioning of a viscous product in more or less thick layers, based on or in the form of deposited points, for mounting of electronic components on a substrate, the process comprising the steps of placing a stencil above, and spaced apart from, the substrate wherein, the stencil has borings of at least two different diameters and which borings correspond to a pattern of the viscous product to be deposited on the substrate and applying the viscous product onto the substrate through the borings in the stencil by passing a scraper over the stencil, the scraper exerting a linear pressure on the stencil perpendicularly to the stencil and to the substrate in a direction opposite the substrate, the linear pressure being sufficient to deform the stencil and to put it in contact with the substrate at the point of the linear pressure, wherein the stencil is constructed of a solid sheet of synthetic material having a substantially uniform thickness whose borings are parallel to each other and perpendicular to the stencil, the pressure exerted on the stencil being sufficient to create an off-contact between the stencil and the substrate on the side of the stencil opposite to the one on which the scraper is passed wherein the amount of viscous product deposited from each boring and the height of the deposited viscous product, are determined according to the thickness of the stencil and the diameter of the corresponding boring, so that each of the deposits that come from borings of substantially the same diameter have substantially the same height.

20. A process for the manufacture of a serigraphy stencil from a solid sheet of a synthetic material having a substantially uniform thickness with bores therethrough for the depositing and apportionment of a viscous product to be used to mount electronic components, the process comprising the steps of:

selecting the sheet thickness according to the greatest height of the deposit of viscous product to be made on the substrate, and making bores in the sheet with different diameters according to the height of the different deposits of the viscous product to be made and the thickness of the sheet selected.

* * * * *